United States Patent [19]
Raser

[11] 3,935,570
[45] Jan. 27, 1976

[54] SPINNING-DISK SHAFT POSITION ENCODER
[76] Inventor: William H. Raser, 6451 W. 83rd St., Los Angeles, Calif. 90045
[22] Filed: July 22, 1974
[21] Appl. No.: 490,857

[52] U.S. Cl. ................. 340/347 P; 235/61.6 A
[51] Int. Cl.² ......................................... G08C 9/04
[58] Field of Search ........... 340/347 P; 235/61.6 A; 250/237

[56] References Cited
UNITED STATES PATENTS

| | | | |
|---|---|---|---|
| 3,038,152 | 6/1962 | Seiffert | 340/347 P |
| 3,098,152 | 7/1963 | VonMathes | 340/347 P |
| 3,349,325 | 10/1967 | Bajars | 340/347 P |
| 3,461,307 | 8/1969 | Rusling et al. | 235/61.6 A |

Primary Examiner—Charles D. Miller

[57] ABSTRACT

An analog-to-digital converter is disclosed which reads the positions of one or more coaxial shafts in terms of time intervals which occur between an interception of a beam of light and the end of a sequence of pulses coming from a spinning magnetized disk. These intervals are measured by pulse counters. If two shafts are being encoded, each disk revolution establishes positional communication with one light beam and two magnetic reading heads.

4 Claims, 3 Drawing Figures

3,935,570

SPINNING-DISK SHAFT POSITION ENCODER

This is an improvement over my co-pending applications, Ser. No. 253,330, entitled "Opaque-Vane Analog to Digital Converter," filed May 15, 1972, and Ser. No. 463,106, now U.S. Pat. No. 3,831,169 entitled "Spinning-Vane Shaft Position Encoder," filed May 22, 1974.

References Cited

U.S. Pat. Nos. 3,098,152 Von Mathes 3,346,724 Fuhrmeister et al. 3,454,777 Marcus

BACKGROUND

The present invention relates to the digital encoding of analog displacements and, particularly, to the making of digital measurements of rotational positions of one or more coaxial shafts.

A common type of shaft angle encoder is one where angular position is determined by means of a coded disk that is provided with a number of concentric tracks, each having alternative transparent and opaque means or sectors. In such encoders, a lamp on one side of the disk and a light-responsive cell on the other side confront a point on each coded track. Production of such encoders involves the difficulty of working with transparent material and the expense of producing accurate coding tracks on such material, which is usually glass. In absolute encoders, the multiplicity of lamps and photocells can create cross talk or make it necessary to collimate to avoid dispersal of light around the edges of opaque sectors. In incremental encoders, there is added cost because of the need for extensive means for determining initial shaft position; also, this reliance on initial determination sometimes allows errors to accumulate.

Many of these mechanical, optical and reliability difficulties are eliminated if the disk has a magnetized surface for generating pulses over a limited angular range. Such a disk need not be brittle, needs neither an energy source nor a collimating system, and operates to produce a reliable absolute count.

PURPOSE OF THE INVENTION

It is the purpose of this invention to provide an analog-to-digital converter which has the reliability and versatility of the typical absolute encoder, the mechanical simplicity and low cost of the typical incremental encoder, and a capability for accuracy beyond that of either. In almost every angle-measuring device of any kind, accuracy can be improved by performing the measuring process at a larger radius. Therefore, it is part of the purpose of this invention to provide the simplicity and configurational characteristics which lend themselves to the construction of encoders of relatively large radius.

It is a further object of this invention to provide a configuration which is adaptable to the encoding of several independent coaxial shafts. For example, U.S. Pat. No. 3,346,724 discloses a machine for which a two-input coaxial encoder is desirable.

Other objects and advantages of the present invention will be more readily apparent from what follows.

DESCRIPTION OF PREFERRED EMBODIMENT

Figure 1:
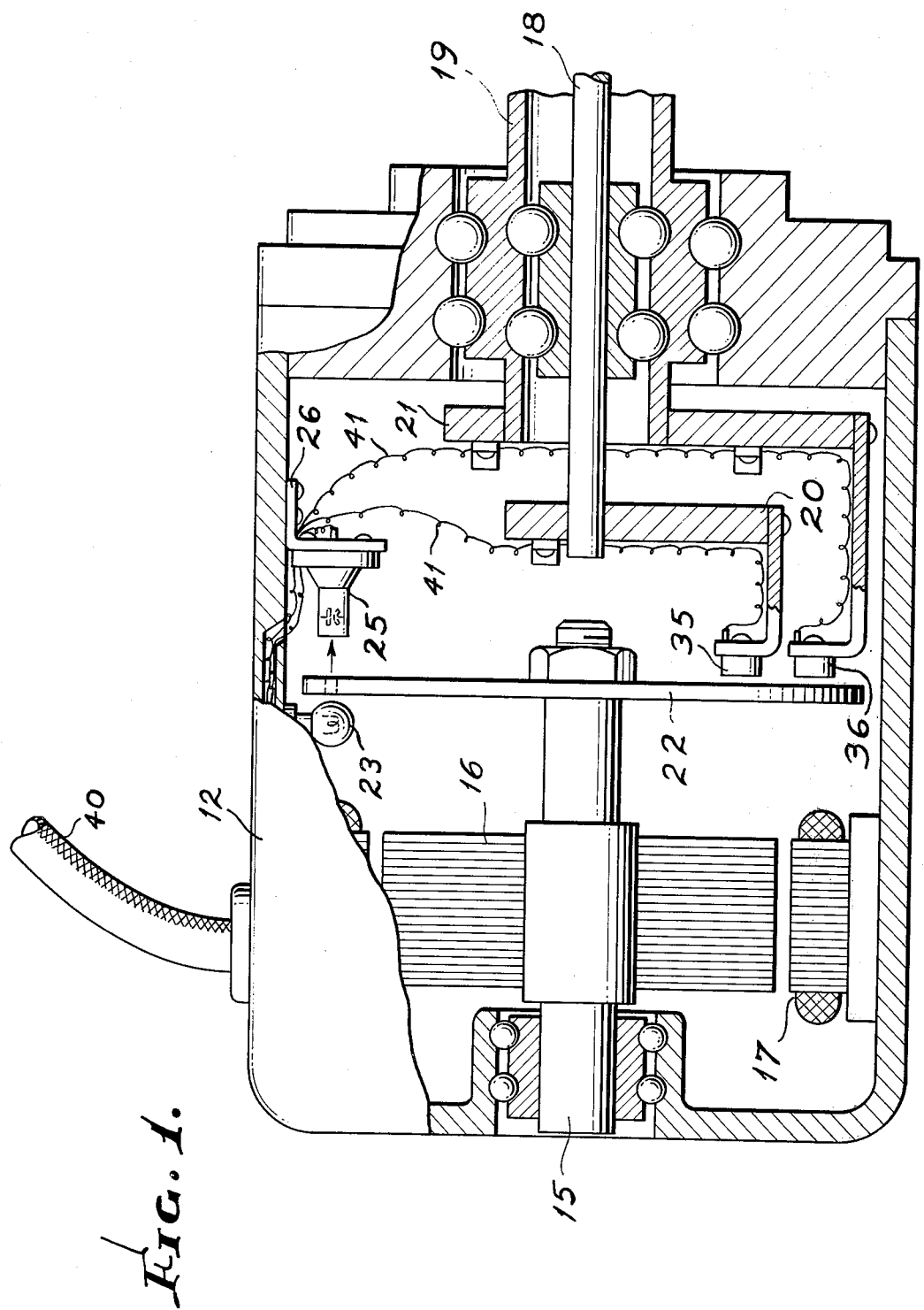
FIG. 1 is an elevational sectional view of the mechanical part of the preferred embodiment of this invention.

The present invention as illustrated in the figures is a twochannel (two-input) digital encoder embodiment having a scanning system contained in a housing 12. In this embodiment, the housing supports bearings for the shaft 15 of a constant-speed electric motor with a rotor 16 and stator 17. The two input shafts, namely, an inner shaft 18 and an outer shaft 19, have the same axis as the motor shaft 15. These inner and outer shafts carry an inner bracket 20 and an outer bracket 21, respectively. The motor carries a magnetized disk 22 fixed to its shaft 15.

The source of illumination for an optical indication of one disk position can be either a lamp or a light-emitting diode. FIG. 1 shows a fixed lamp 23 mounted on the housing 12.

One narrow slit or hole 24 exists in the disk 22 so as to pass some light originating at the lamp 23 once per revolution of the shaft 15. A photodetector 25 is mounted on a housing-mounted bracket 26 to receive any light not shaded by the disk. The photodetector can be a photocell or other illumination-sensing device.

An inner magnetism-sensing head 35 and a similar outer head 36 are mounted on the inner bracket 20 and the outer bracket 21, respectively. Each of these heads confronts a point or small area on the disk 22, either by touching it or being very close. In each case, the confronting points form a circle or an arc of a circle, the exact point on the circle being determined by its respective shaft position. On the disk surface, an arc in each of these circles is magnetically loaded; i.e., a track of magnetic anomalies exists so as to generate pulses in the heads 35, 36 as the disk is rotated past them. The method of forming these anomalies is well known to those skilled in the computer tape and disk memory art.

Figure 2:
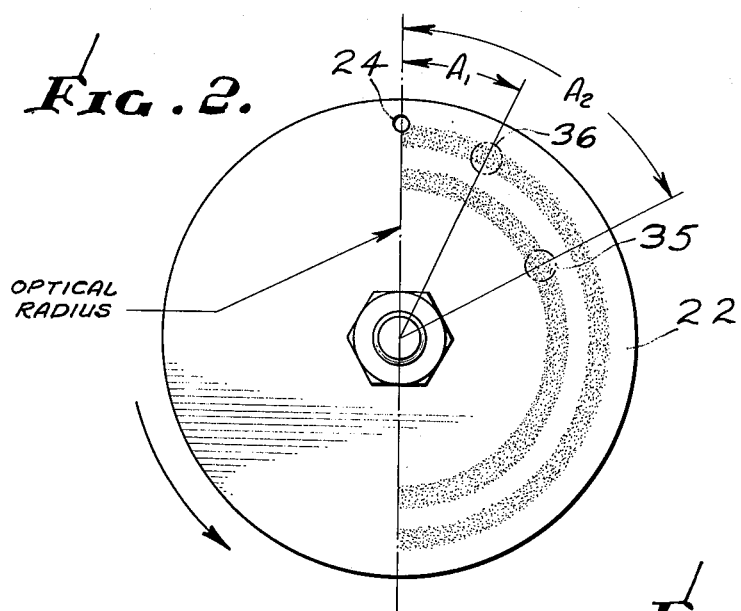
FIG. 2 is an elevational view of one of the elements of FIG. 1, namely, the magnetized disk.

FIG. 2 shows a view of disk 22 in which, in this embodiment, the disk rotation is viewed to have a counter-clockwise direction. The disk radius which goes through the center of the narrow hole 24 is called the optical radius; the position of this radius corresponding to the instant when the hole is aligned to develop a pulse from the photodetector 25 is called the optical position. The pulse from the photodetector is fed into a monostable multivibrator which is also called a one shot 39. The output from the one shot is a pulse having a duration of, say, the time of one half of a revolution of the disk. More accurately, the optical position is the position of the disk 22 at the beginning of the output pulse from each one shot 39. See FIG. 3.

The one shots and other circuits are connected to the mechanical parts shown in FIG. 1 by means of a cable 40. Some of the wires in this cable come from the magnetic heads. These head wires 41, 41 must be flexible because the heads are positioned by the input shafts 18, 19. Mechanical limit stops may be used to limit the shaft position ranges to, say, one half of one revolution each although these stops are not shown. If type T flip flops and an extra head are added, the measured ranges of shaft angles can exceed 360°.

Since this embodiment is a two-input encoder, the circuitry makes two measurements simultaneously and contains two channels. Channel 1 measures the angle of the outer shaft 19 and Channel 2 encodes the inner shaft angle; these are angles $A_1$ and $A_2$, respectively.

In Channel 1, an AND gate 45 combines the pulses from the first head 36 with the complement of the pulse from the one shot 39. It performs the Boolean AND function. The output is the head pulse train inhibited by the one shot. This output is fed to a counter 46 which is reset once per revolution. In Channel 2, a second AND gate 47 and a second counter 48 perform a second digital measurement. In both counters, parallel binary bits from Yo to Yn indicate the shaft angles once each revolution of the disk.

In the sequence in which they occur, the events which form a measurement of the position of shaft 19 are as follows:

1. The Channel 1 counter is reset (cleared).
2. The disk rotates counterclockwise until the first magnetic anomaly (bit) in the outer arc of disk 22 appears under head 36. At this instant in time, the first counter 46 begins to count.
3. During the time required for the disk to revolve through the angle shown as $A_1$ in FIG. 2, counter 46 is counting. The relative position of disk 22 and head 36 is now as shown in FIG. 2. This is the so-called optical position.
4. At this position, the photodetector 25 triggers the one shot 39 and the gate 45 is inhibited. This stops the counter.
5. By the time the one shot 39 returns to its stable state, the last of the magnetized bits has passed by head 36. Therefore, the count corresponding to angle $A_1$ remains for the rest of one revolution of the disk. Angle $A_1$ is the position of shaft 19.

During the same revolution, the second counter 48 measures the position of the inner shaft 18 in a similar manner using head 35 and gate 47. If no second channel exists, this becomes a one-channel encoder like other shaft encoders. Because of the small space occupied by each magnetic head, it is possible to have many channels of encoding in one housing using one disk.

The above embodiment assumes a uniform distribution of magnetic anomalies around a 180° (say) arc of a circle on the disk for each channel. However, because a reading head can serve as a writing head and because of the adaptability of this type of recording, it is practical for non-linear bit spacing to serve useful purposes.

For example, consider the requirements for a trigonometric resolver instead of for an ordinary shaft encoder. That is, consider the requirement for the counter to measure the sine of A rather than A itself.

Let s represent the bit spacing and r represent the radius of a track of bits (arc of magnetic anomalies). Let C represent a total count or a constant defined by accuracy specification. If fractional counts are ignored, summation can be considered to be equal to integration and the track will generate a sine wave if $$C \sin A = \int_0^A r/s \, dA$$

Differentiating, $$C \cos A = r/s \quad s = r/C \cos A$$

This simply means that instead of being a constant, the bit spacing s must be a function of the angle, A. In other words, a track $S_1$ can be used to generate a sine function of $A_1$ and, using a different pattern, $S_2$ can be used to generate a cosine function of $A_2$. If shaft 18 and shaft 19 are tied together, the result is a sine and a cosine function of a single shaft angle.

Figure 3:
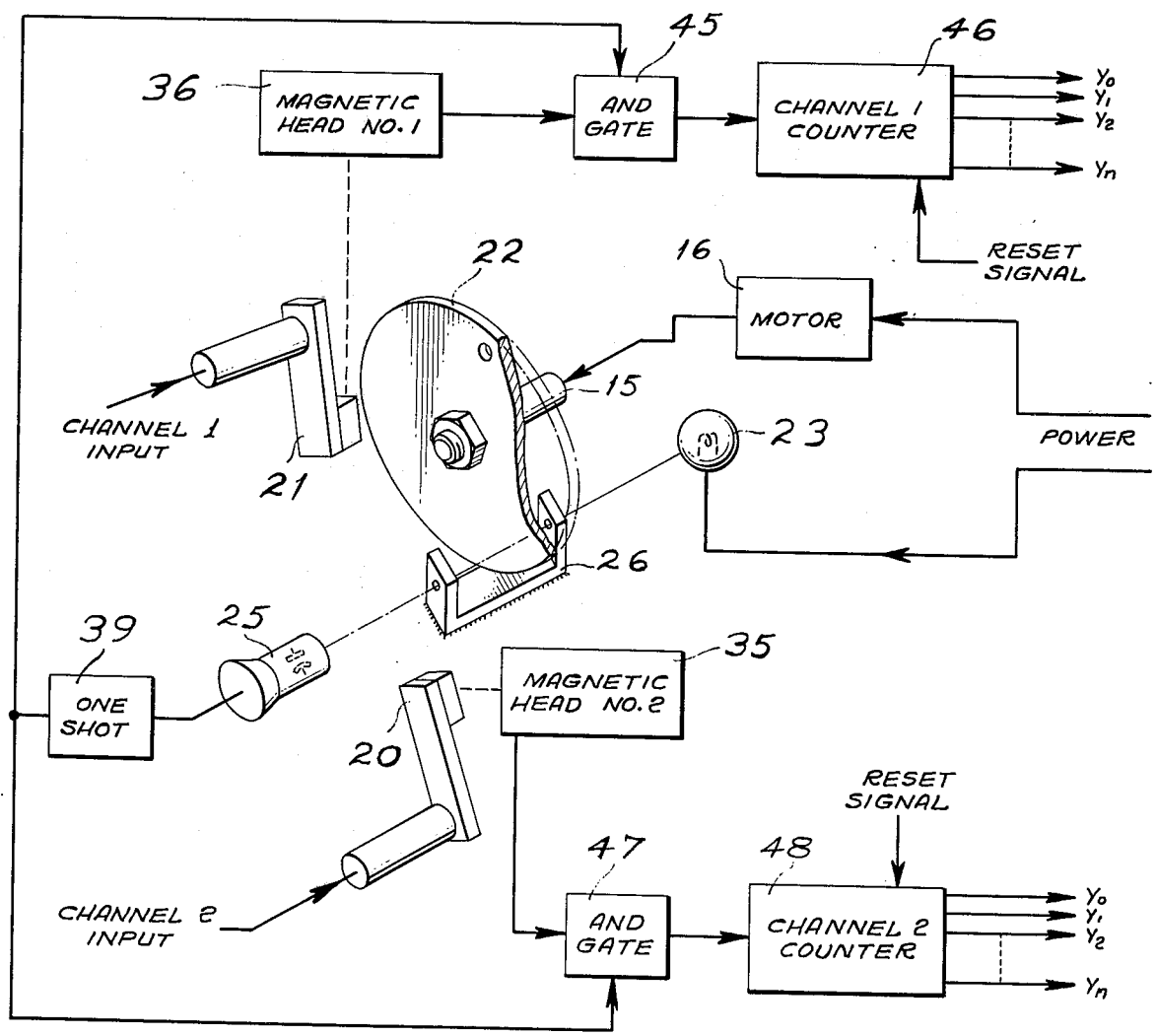
FIG. 3 is a perspective view of the main elements of FIG. 1; this figure also shows a block diagram of the electronics needed to complete the analog-to-digital conversion.

In FIGS. 1 and 3, the representation of the photodetector 25 is somewhat non-standard. This serves to indicate a sensing system rather than just a photocell. In particular, the cylindrical part of what is shown could be a part of an optical fiber for reshaping the beam of light.

I claim:

1. Apparatus for making digital measurements of shaft angular positions comprising:
    a housing having an axis and having a protruding shaft rotatably mounted on this axis;
    a housing-mounted bracket supporting an optical scanning means for producing and sensing a beam of light in a direction parallel to the axis of said housing;
    a first shaft-mounted bracket supporting a magnetic scanning means;
    an internal shaft rotatably supported about the axis of said housing;
    motive means to rotate said internal shaft;
    a magnetically-alterable opaque disk mounted on said internal shaft for communicating with the scanning means on each of said brackets once per revolution of said internal shaft, the magnetic communication thereof operating to generate impulses as a consequence of the angular velocity of said internal shaft;
    a pulse counter fed by said disk, the number of pulses per disk revolution being proportional to a shaft displacement angle so as to provide a first shaft angle measurement;
    a second protruding rotatably-mounted shaft coaxial with the first;
    a second shaft-mounted bracket with a second magnetic scanning head; and
    a second pulse generating and counting means for providing a digital measurement of the angle of said second protruding shaft.

2. Apparatus in accordance with claim 1 where the bit spacing of magnetic anomalies on said disk is inversely proportional to a trigonometric function of disk rotation angle in order to produce an output in a magnetic scanning head proportional to the trigonometric cofunction of this angle.

3. Apparatus as set forth in claim 1 wherein said motive means comprises a constant speed motor and a shaft, this shaft having some intermediate point where torsional rigidity is so low that torsional vibrations coming from the motor are isolated and unable to disturb the damped speed of the disk.

4. Apparatus in accordance with claim 1 further comprising:
    additional individually rotatable shafts protruding from said housing, all of said shafts as well as said housing having a single axis;
    one additional scanning means for each said additional protruding shaft; and
    one additional channel of pulse-counting circuitry for each said additional protruding shaft, said additional channel serving to perform a digital shaft angle measurement of said additional protruding shaft.

* * * * *